(12) United States Patent
Havermann (10) Patent No.: US 9,161,436 B2
(45) Date of Patent: Oct. 13, 2015

(54) CONNECTION DEVICE AND CONNECTION METHOD FOR HIGH-FREQUENCY DIGITAL SIGNALS

(75) Inventor: Gert Havermann, Wallenhorst (DE)

(73) Assignee: Harting Electronics GMBH, Espelkemp (DE)

( * ) Notice: Subject to any disclaimer, the term of this patent is extended or adjusted under 35 U.S.C. 154(b) by 114 days.

(21) Appl. No.: 14/002,081

(22) PCT Filed: Feb. 22, 2012

(86) PCT No.: PCT/DE2012/100044
§ 371 (c)(1),
(2), (4) Date: Aug. 28, 2013

(87) PCT Pub. No.: WO2012/122974
PCT Pub. Date: Sep. 20, 2012

(65) Prior Publication Data
US 2015/0144391 A1        May 28, 2015

(30) Foreign Application Priority Data

Mar. 11, 2011        (DE) .......................... 10 2011 001 225

(51) Int. Cl.
*H05K 1/02*        (2006.01)
*H01R 12/53*        (2011.01)
*H01R 13/6471*        (2011.01)

(52) U.S. Cl.
CPC .............. *H05K 1/0245* (2013.01); *H01R 12/53* (2013.01); *H01R 13/6471* (2013.01)

(58) Field of Classification Search
CPC ............................. H05K 1/02; H05K 1/0245
USPC ............................................. 174/262, 113 R
See application file for complete search history.

(56) References Cited

U.S. PATENT DOCUMENTS

| | | | |
|---|---|---|---|
| 4,508,415 A | 4/1985 | Bunnell | |
| 6,380,485 B1 | 4/2002 | Beaman et al. | 174/88 R |
| 6,394,839 B2 | 5/2002 | Reed | |
| 6,575,789 B2 * | 6/2003 | Bassler et al. | 439/607.23 |
| 8,696,378 B2 * | 4/2014 | Behziz et al. | 439/497 |

(Continued)

FOREIGN PATENT DOCUMENTS

| | | | | |
|---|---|---|---|---|
| CN | 101026279 A | 8/2007 | | |
| EP | 1202419 | 10/2001 | ............... | H02G 3/04 |

(Continued)

OTHER PUBLICATIONS

PCT International Search Report issued in corresponding application No. PCT/DE2012/100044, dated Jul. 5, 2012 (2 pgs).

*Primary Examiner* — Timothy Thompson
*Assistant Examiner* — Charles Pizzuto
(74) *Attorney, Agent, or Firm* — Hayes Soloway PC (57) ABSTRACT

In order to improve the signal integrity, for a connection device for twinax cables the connecting pad belonging to the respective drain wire is disposed directly between the two connecting pads of the two leads belonging to the same data line. Groups of connecting pads can be disposed so that they are offset with respect to one another in order to prevent crosstalk. To this end the data lines can be fastened to the connection device, which for example consists of a circuit board.

9 Claims, 6 Drawing Sheets

(56) References Cited

U.S. PATENT DOCUMENTS

| | | | |
|---|---|---|---|
| 2003/0017730 A1* | 1/2003 | Bassler et al. | 439/108 |
| 2003/0064616 A1 | 4/2003 | Reed et al. | 439/108 |
| 2004/0067680 A1 | 4/2004 | Wu | |
| 2004/0229510 A1 | 11/2004 | Lloyd et al. | |
| 2010/0294530 A1 | 11/2010 | Atkinson et al. | 174/78 |

FOREIGN PATENT DOCUMENTS

| | | | | |
|---|---|---|---|---|
| JP | 2003346987 A | 12/2003 | | |
| JP | 2004071374 A | 3/2004 | | |
| JP | 2004134128 A | 4/2004 | | |
| WO | WO2004062046 | 7/2004 | | H01R 13/658 |

\* cited by examiner

Prior art

Fig. 1

Prior art

Fig. 7

CONNECTION DEVICE AND CONNECTION METHOD FOR HIGH-FREQUENCY DIGITAL SIGNALS

DESCRIPTION

The invention relates to a connection device for high-frequency data signals, intended for connecting one or more electrical data lines which are suitable for transmitting high-frequency data signals, wherein each data line has three electrical conductors, specifically a first core, a second core and a drain wire, wherein the two cores are each surrounded by a cylindrical insulation, and wherein each data line is surrounded by a shield, for example by a shielding foil which is electrically conductive at least on one side, and wherein the connection device has a connection pad for each electrical conductor.

In this case, the term "high-frequency digital signals" is intended to be understood to mean digital signals which have a bit rate of more than 10 GBit/sec, in particular even 25 GBit/sec or more. Data lines of this kind are known by the names "twinax" or "shielded twisted pair".

The invention also relates to a method for connecting one or more electrical data lines to associated connection pads, wherein the data lines are suitable for transmitting high-frequency digital signals, wherein each data line has three electrical conductors, specifically a first core, a second core and a drain wire, wherein the two cores are each surrounded by a cylindrical insulation, and wherein each data line is surrounded by a shield, for example by a shielding foil which is electrically conductive at least on one side.

A connection device of this kind, for example a printed circuit board or a plug connector, and a connection method of this kind are required in order to ensure signal integrity which is as good as possible at the corresponding electrical transition when an electrical data line is connected.

PRIOR ART

The prior art already discloses a large number of solutions for connecting an electrical data line of this kind.

For example, EP1202419A1 describes a corresponding connection method in which the mismatching of the differential impedance of a connection region of the cable is reduced using a heat-shrink tube. To this end, the shield is removed from a so-called "twisted pair" cable, the two conductors of this cable being twisted together in the normal state, in the connection region of said cable, and the two conductors are routed in parallel with the drain wire situated between them. Constant distances between the conductors and the drain wire are guaranteed by the heat-shrink tube. This produces twinax-like conductor guidance in the connection region. Furthermore, said document also discloses guiding and connecting the drain wire and the pair of cores on different sides of the printed circuit board.

U.S. Pat. No. 6,380,485B1 describes a connection unit for a twinax cable. To this end, said document discloses a printed circuit board to which the twinax cable is connected and which allows a good ground connection to the associated drain wire. To this end, the drain wire is bent at a right angle to the conductors and is inserted into a recess in the ground rail which has a large surface area.

Furthermore, said document mentions an arrangement in which a large number of twinax cables are connected to a printed circuit board in a conventional manner by means of a printed circuit board plug connector as known prior art. This shows that it is known to arrange the conductors next to one another in pairs on the associated connection pad and to separate them from the next pair of conductors by their drain wire which is connected directly next to them.

One disadvantage of the prior art is that the homogeneity of coupling in the electrical transition between electrical data lines of this kind and an electrical device, for example a printed circuit board or a plug connector, which is connected to said data line, in the associated connection region is insufficient for the ever-increasing data rates required.

PROBLEM

The invention is therefore based on the problem of minimizing impedance irregularities in the connection region.

This problem is solved by a connection device of the kind cited in the introductory part in that the connection pad, which belongs to the respective drain wire, is arranged between the two connection pads of the two cores which belong to the same data line.

This problem is also solved by a method of the kind cited in the introductory part in that the two cores which belong to one cable are guided as far as their respective connection pads at a virtually constant effective distance, and are connected to said connection pads there.

In this case, the term "effective distance from one another" denotes the sum of a first distance and a second distance. In this case, the first distance is measured between the first core and the drain wire, and the second distance is measured between the second core and the drain wire. In this case, use is made of the fact that the electrical fields of the first core and of the second core are coupled one into the other to a great extent by means of the drain wire.

The term "virtually constant effective distance from one another" is accordingly to be understood to mean that the drain wire makes contact with the two cylindrical insulations. In this case, the term "virtually" is defined by the geometric quality of the round cross section of the cylindrical insulation.

Advantageous refinements of the invention are indicated in the dependent claims.

The invention is a device which is required to improve the signal integrity of high-frequency data transmission operations.

One advantage of the present invention is that the irregularities in the electrical impedance in the connection region are reduced, as a result of which good coupling is provided and it is possible for high data rates to be transmitted by means of this connection.

A further advantage is that the connection of the electrical data line can be performed manually at reasonable expense.

For example, a longitudinal cut can be made in the shield, in particular during the insulation-stripping operation. The cable is then aligned with the printed circuit board. In this case, the longitudinal slit makes it possible to push the cable down to the level of the printed circuit board, wherein the drain wire pushes the cylindrical insulations apart.

A corresponding tool can be used for the pushing-down operation. This tool has guide ribs which guide and align the insulations and therefore the electrical conductors.

In a further advantageous embodiment, the connection apparatus has at least two groups of connection pads which are arranged offset in relation to one another. In this case, a "group of connection pads" is to be understood to mean three connection pads which are intended to form a connection with three electrical conductors of a data line. The connection device has a straight edge in its connection direction, that is to say in that direction from which the data lines are guided to the connection apparatus. Therefore, the offset arrangement results in at least one group of connection pads being at a different distance from the straight edge than at least one other group of connection pads.

In a further embodiment, the connection apparatus has more than two groups of connection pads. In this case, the offset arrangement means that the arrangement of groups of connection pads on the printed circuit board differs from a straight arrangement. In this case, the term "straight arrangement" means an arrangement in which the group of connection pads are arranged on the printed circuit board in a row, that is to say lie on a straight line. Accordingly, the clause "that the arrangement of groups of connection pads on the printed circuit board differs from a straight arrangement" means that at least one group of connection pads does not lie on the straight line which runs through at least two other groups of connection pads.

One advantage of this embodiment is that crosstalk between the various groups of connection pads is greatly reduced.

A further additional advantage of this embodiment is that, specifically when there are a large number of data lines, the run-time differences in said data lines can be compensated because differences in travel can be compensated without problem. This plays an important role because, specifically in the field of high-frequency data transmission, even differences in cable length in the millimeter range to the centimeter range can lead to relevant run-time differences, this usually making connection considerably more difficult.

In a preferred embodiment, the connection device is a printed circuit board.

In a further advantageous refinement, the data lines can be fastened, for example using double-sided adhesive tape, on the connection apparatus, in particular on a printed circuit board and later encapsulated by an encapsulation compound, together with further components, in an encapsulation process.

In a preferred embodiment, the connection device is a plug connector or at least a part of a plug connector.

EXEMPLARY EMBODIMENT

An exemplary embodiment of the invention is illustrated in the drawing and will be explained in greater detail below. In the drawing.

Figure 1:
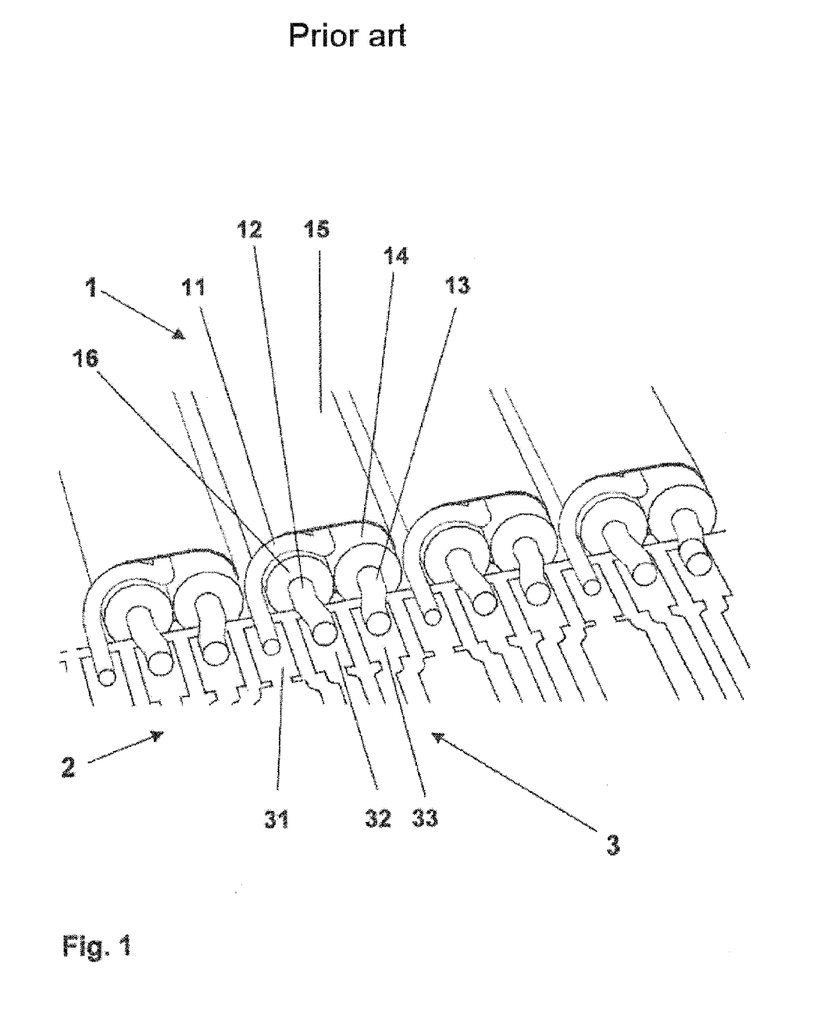
FIG. 1 shows an oblique plan view of a connection device according to the prior art having a plurality of electrical data lines connected to it.

FIG. 1 shows an arrangement which is known from the prior art and is usually used. In this case, a data line 1 is connected to a connection apparatus 2, together with a plurality of identical data lines. In addition to a shield 15, the data line 1 has a first core 12 and a second core 13, said cores each being surrounded by a cylindrical insulation 16, 14. The data line 1 also has a drain wire 11. The printed circuit board 2 has a group of connection pads 3 for the two cores 12, 13 and for the drain wire 11 of the data line 1, specifically a first connection pad 31 for the drain wire 11, a second connection pad 32 for the first core 12, and a third connection pad 33 for the second core 13. In this case, the connection pads 32, 33 of the two cores 12, 13 are situated directly next to one another. The connection pad 31 of the drain wire 11 is situated between the connection pads of this pair of cores 12, 13 and the connection pads of a pair of cores of an adjacent data line, in order to improve the electrical separation thereof as a result.

Figure 2:
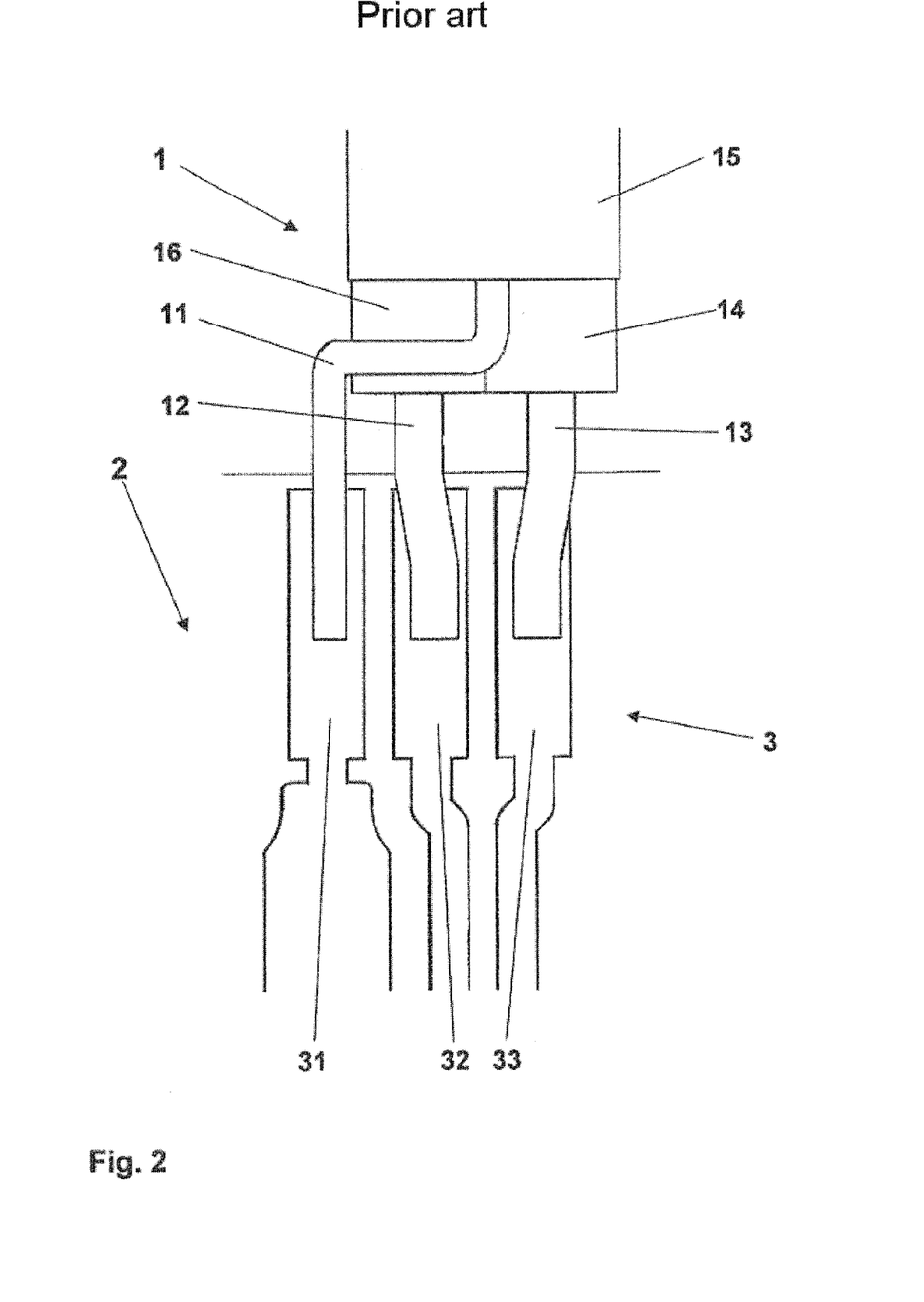
FIG. 2 shows a plan view of a part of the connection device according to the prior art with one of the electrical data lines connected to it.

FIG. 2 shows the same arrangement for the individual data line 1 and for the associated group of connection pads 3 in plan view for better clarity.

Figure 3:
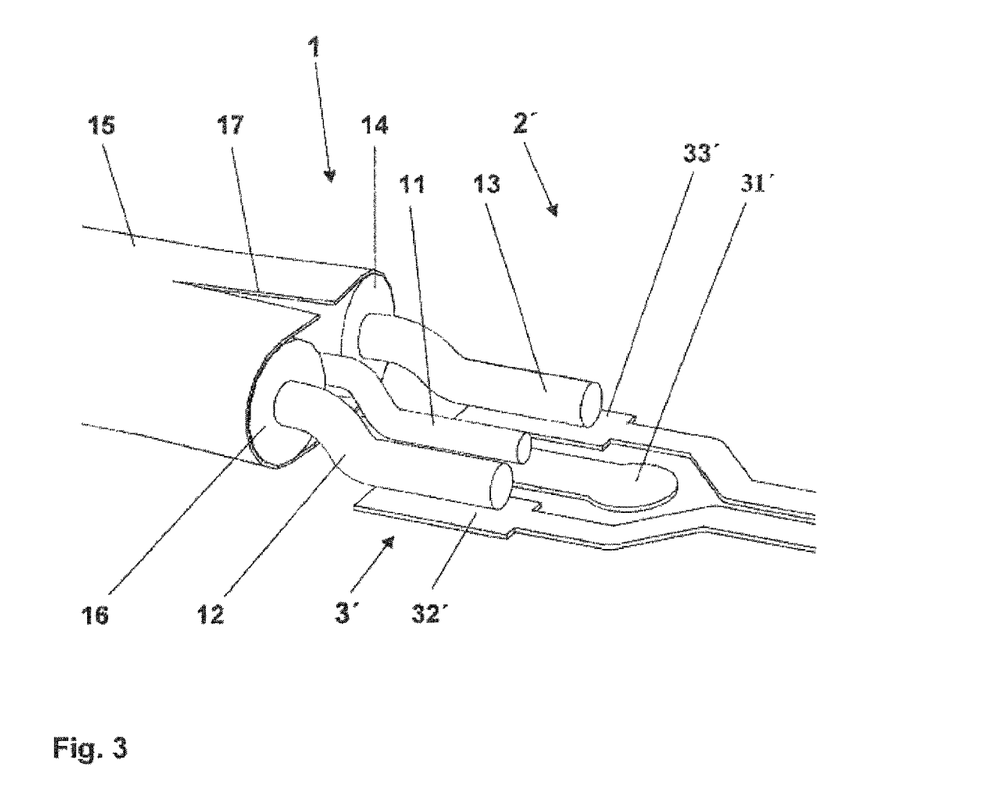
FIG. 3 shows an oblique plan view of a connection device according to the invention with the electrical data line connected to it.

FIG. 3 shows an arrangement according to the invention. In this figure, the edge of the connection device 2' is not graphically illustrated. The shield 15 of the data line 1 has a longitudinal cut 17. This allows the two cores 12, 13 to be slightly bent away from one another in an opened region. The drain wire 11 is guided upward between the two insulations 14, 16 and, in the process, is in continuous mechanical contact with said insulations.

Accordingly, the connection pad 31' of the drain wire 11 is located between the two connection pads 32', 33' of the associated pair of cores 12, 13.

Figure 4:
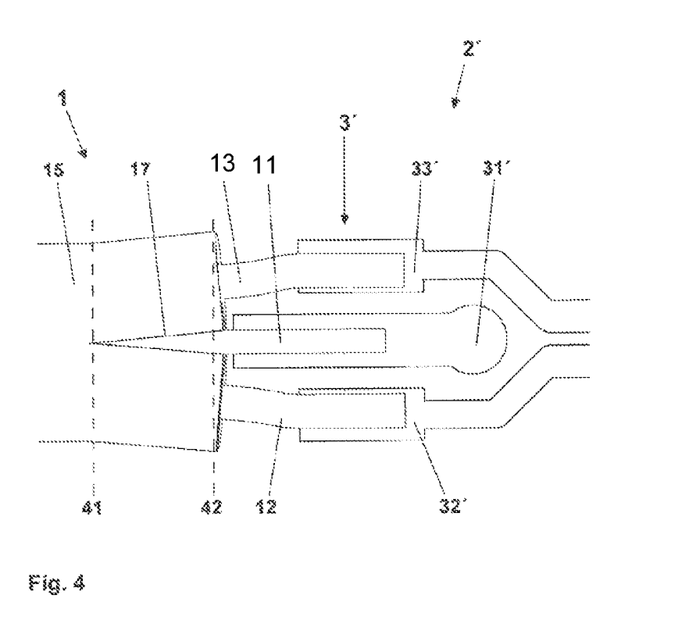
FIG. 4 shows a plan view of a connection device according to the invention with the electrical data line connected to it.

FIG. 4 shows the abovementioned arrangement in a plan view for better clarity. This figure clearly shows that the two cores 12, 13 are bent away from one another in the opened region over the length of the slot 17. Furthermore, the start of the opened region 41 and the end of the opened region 42 are identified. The edge of the connection device 2' is not graphically illustrated in this illustration either.

Figure 5:
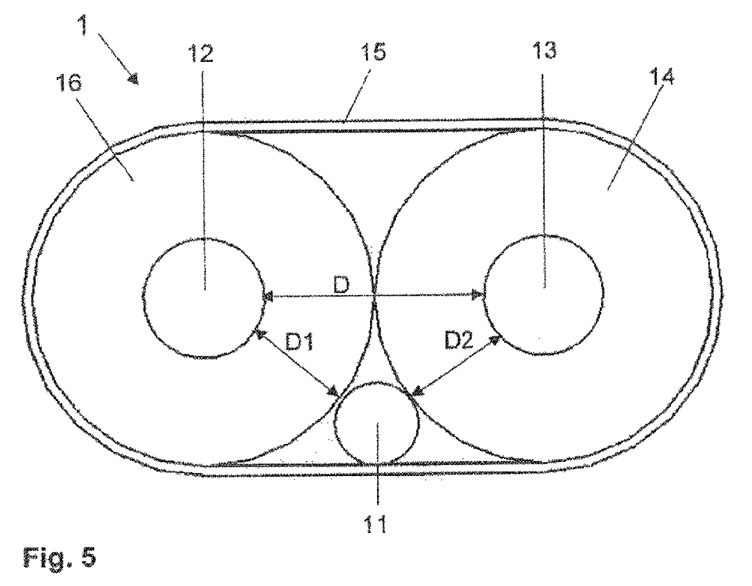
FIG. 5 shows a cross section through a region of the electrical data line which has not been stripped of insulation.

FIG. 5 shows a cross section through the data line 1 in the normal state, that is to say, for example, at the start 41 of the opened region. The insulations 14, 16 make contact with one another. The two cores are at a distance D from one another. The first core 12 is at a distance D1 from the drain wire 11. The second core 13 is at a distance D2 from the drain wire 11. Since the drain wire 11 makes contact with the two cylindrical insulations 14, 16, the effective distance is: D1+D2=D.

Figure 6:
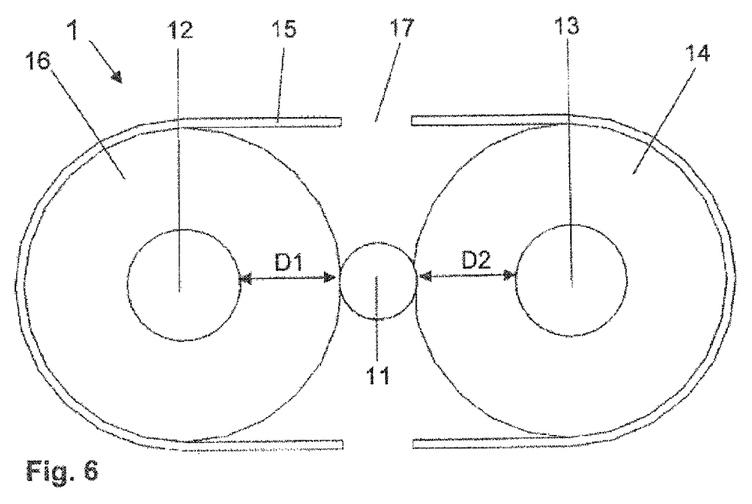
FIG. 6 shows a cross section through the transition between an opened region and a region of the electrical data line which has been stripped of insulation.

FIG. 6 shows a cross section through the data line at the end 42 of the opened region. The cores are at a further distance from one another than in the abovementioned illustration in accordance with the slot 17 of the shield. The cores 12, 13 couple one into the other substantially by means of the drain wire 11. As a result, their effective distance is maintained. Even though the geometric distance D between the two cores 12, 13 in the connection region is increased, the effective distance D1+D2 remains the same, as a result of which the irregularities in the impedance in the connection region are reduced.

Figure 7:
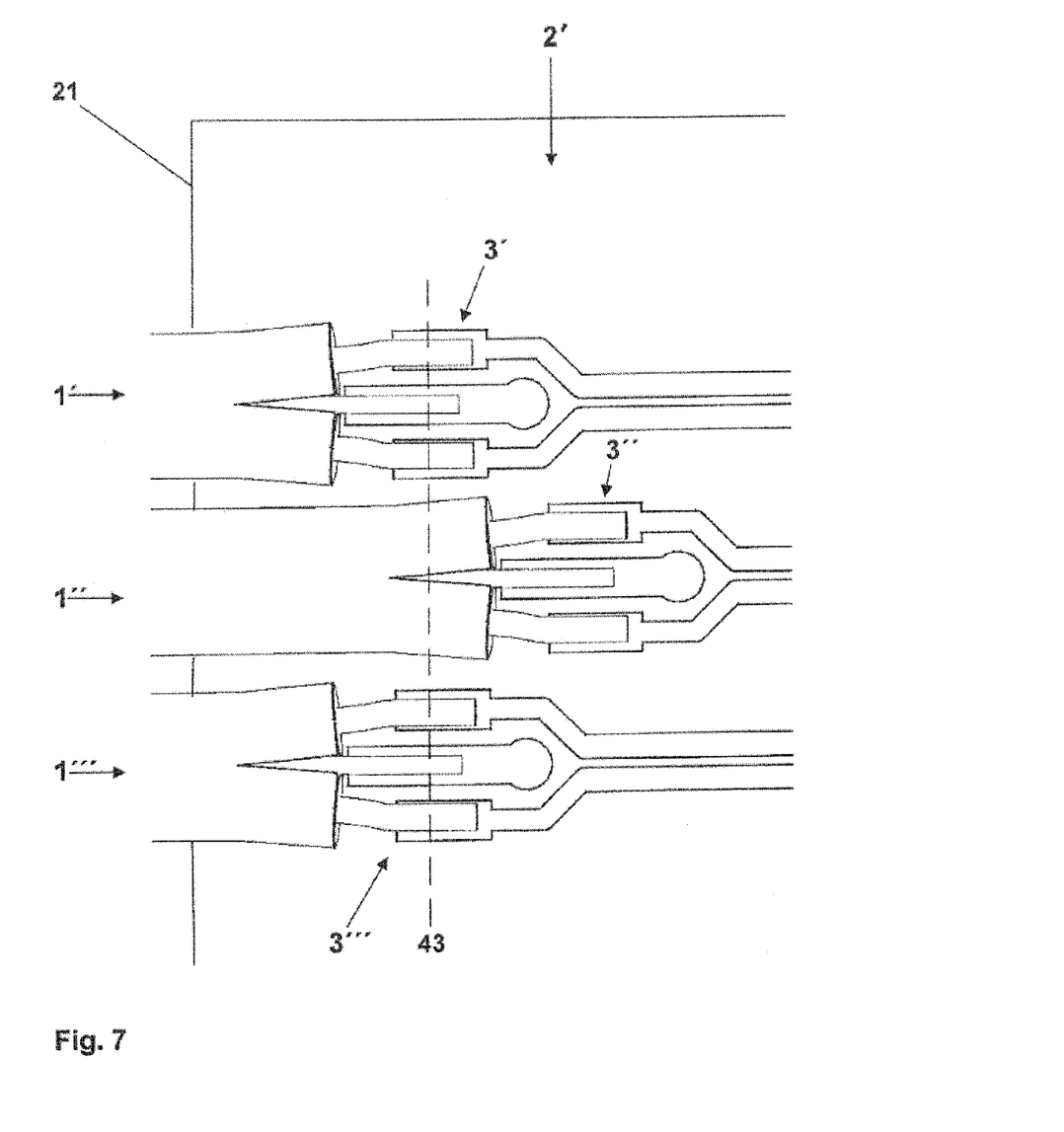
FIG. 7 shows an electrical apparatus according to the invention having a plurality of groups of connection pads which are arranged in an offset manner.

FIG. 7 shows a plan view of an electrical apparatus according to the invention having a first group of connection pads 3', a second group of connection pads 3" and a third group of connection pads 3'". These groups of connection pads 3', 3", 3'" are at different distances from a straight edge 21 of the printed circuit board 2', that is to say at least one group 3" is at a different distance from the straight edge 21 than at least one other group of connection pads 3', 3'". Looking along a straight line 43 which runs through the first group 3' and the third group 3'", it can be seen that the second group 3" does not lie on this line 43.

This illustration shows that electrical crosstalk between the different groups of connection pads 3', 3", 3'"" is greatly reduced by the offset arrangement of said groups since, in this way, the unshielded parts of a data line 1', 1''' come to rest next to shielded parts of another data line 1''.

LIST OF REFERENCE SYMBOLS

Connection Device and Connection Method for High-frequency Digital Signals

File ref. P211-14 WO 0
1 Data line
11 Drain wire
12 First core
13 Second core
14 Cylindrical insulation of the second core
15 Shield
16 Cylindrical insulation of the first core
17 Longitudinal slit
2, 2' Connection device
21 Straight edge of the connection device
3 Group of connection pads
31 Connection pad of the drain wire
32 Connection pad of the first core
33 Connection pad of the second core

The invention claimed is:

1. An arrangement comprising a connection device for high-frequency data signals and at least one data line, in particular a so-called "twinax" cable, which is intended to be connected to said connection device, wherein the data line is suitable for transmitting high-frequency data signals of 10 GBit/sec and more and has three electrical conductors, specifically a first core, a second core and a drain wire, wherein the two cores are each surrounded by a cylindrical insulation, and wherein the at least one data line is surrounded by a shield, for example by a shielding foil which is electrically conductive at least on one side, and wherein the connection device has one connection pad for each electrical conductor, characterized in that the connection pad, which belongs to the respective drain wire, is arranged between the two connection pads of the two cores which belong to the same data line, wherein the two cores are bent away from one another in an opened region which has a start and an end, and in that the drain wire is in continuous mechanical contact with the associated insulations in this opened region.

2. The arrangement as claimed in claim 1, characterized in that the connection device has at least two groups of connection pads, wherein each group of connection pads is intended form a connection with the electrical conductors of in each case one data line, wherein the connection device has a straight edge in its connection direction, and in that at least one group of connection pads is at a different distance from the straight edge than at least one other group of connection pads.

3. The arrangement as claimed in claim 1, characterized in that the connection device has at least three groups of connection pads, wherein each group of connection pads is intended to form a connection with the electrical conductors of in each case one data line, and in that the arrangement of the groups of connection pads on the connection device differs from a straight arrangement.

4. A method for using an arrangement as claimed in claim 1, characterized in that the two cores are bent away from one another in the opened region by the drain wire pushing the associated insulations apart.

5. A method for using an arrangement as claimed in claim 2, characterized in that the two cores are bent away from one another in the opened region by the drain wire pushing the associated insulations apart.

6. A method for using an arrangement as claimed in claim 3, characterized in that the two cores are bent away from one another in the opened region by the drain wire pushing the associated insulations apart.

7. The method as claimed in claim 4, characterized in that a longitudinal slit is made in the shield.

8. The method as claimed in claim 7, characterized in that the two cores are bent away from one another in the region of the longitudinal slit.

9. The method as claimed in claim 8, characterized in that the drain wire is pushed between the insulations of the two cores in the region of the longitudinal slit, and therefore ensures a virtually constant effective distance $(D1+D2)$ between the cores.

* * * * *